United States Patent [19]

Johnson et al.

[11] Patent Number: 5,406,125
[45] Date of Patent: Apr. 11, 1995

[54] SEMICONDUCTOR DEVICE HAVING A METALIZED VIA HOLE

[75] Inventors: Gerald E. Johnson, Littleton; Michael D. Medley, Elizabeth, both of Colo.

[73] Assignee: Martin Marietta Corp., Bethesda, Md.

[21] Appl. No.: 227

[22] Filed: Apr. 15, 1993

[51] Int. Cl.$^6$ .................... H01L 23/02; H01L 23/13; H01P 3/08
[52] U.S. Cl. .................... 257/774; 257/734; 257/664; 333/247
[58] Field of Search .............. 257/734, 737, 738, 758, 257/774, 775, 777, 644; 333/247, 248

[56] References Cited

U.S. PATENT DOCUMENTS

| | | | |
|---|---|---|---|
| 3,761,782 | 9/1973 | Youmans | 257/774 |
| 3,867,759 | 2/1975 | Siefker | 333/238 |

*Primary Examiner*—Andrew J. James
*Assistant Examiner*—Carl Whitehead, Jr.
*Attorney, Agent, or Firm*—Edwin H. Crabtree; Martin G. Anderson; Gay Chin

[57] ABSTRACT

A semiconductor device having a metalized via hole used when mounting and connecting semiconductor chips, such as microwave chips, digital chips, analog chips and the like, on a top portion of a metalized carrier substrate is described herein. Each chip includes electrical circuitry on a top portion thereof with the circuitry connected to one end of a transmission line. Another end of the transmission line is connected to a metalized via hole. The via hole passes from the top portion of the chip to a bottom portion of the chip. The chip when mounted on the substrate is positioned over the top portion of the substrate and lowered thereon either by hand or with a mechanical chip carrying device. The bottom portion of the metalized via hole is indexed over a top of one end of a transmission line on the top portion of the substrate with the indexing tolerance between the two interfacing surfaces in a range of 0.5 to 10 mils. The close tolerance of less than one mil and up to 10 mils or greater may vary depending on the frequency of the application. Also, the close tolerance of the connection allows for proper alignment and uniform impedance transition between the chip and the substrate. After indexing the bottom of the via hole on top of the end of the transmission line on the substrate, the chip is bonded to the substrate. The semiconductor chip may be attached to the carrier substrate using solder. A very thin layer of solder is used to minimize thermal and electrical resistance and to establish a necessary integrity of chip-to-substrate interface attachment.

14 Claims, 3 Drawing Sheets

SEMICONDUCTOR DEVICE HAVING A METALIZED VIA HOLE

BACKGROUND OF INVENTION (a) Field of the Invention

This invention relates to a method of mounting semiconductor chips and more particularly, but not by way of limitation, to a method of mounting microwave, digital, analog chips and the like on a top portion of a metalized carrier substrate such as a mother board and making electrical connections thereto.

(b) Discussion of Prior Art

Heretofore, semiconductors have been used to manufacture microwave devices for many years. The use of newer materials, such as GaAs, have become increasingly important in recent years due to demands for better performance at higher frequencies. Currently, a large investment is being made into Monolithic Microwave Integrated Circuit (MMIC) technology which offers an efficient and cost effective method of integrating a number of complex functions onto a single chip. It is therefore becoming common to mount one or more complex circuits, e.g., a MMIC chip, rather than a single transistor, into either a small microwave hermetically sealed package or a hybrid assembly such as a Microwave Integrated Circuit (MIC). In either case, it is necessary to make electrical connections between conductors on the semiconductor and the package or carrier substrate. Except for beam lead devices, these connections are typically made with wire or ribbon bonds. These bonds generally introduce significant undesirable reactance which affects the circuit performance. Also, the reactance of these bonds varies from one circuit to another, especially when the bonds are made manually. On complex chips, a large number of bonds are frequently required, introducing performance uncertainty, high assembly costs and reliability concerns. The subject invention provides a method of mounting semiconductor chips eliminating the need for the above mentioned wire and ribbon bonds and the associated undesirable characteristics related thereto.

In U.S. Pat. No. 4,980,753 to Dunaway et al, U.S. Pat. No. 3,801,938 to Goshgarian, U.S. Pat. No. 3,768,050 to Stiles, Jr., U.S. Pat. No. 3,838,443 to Laighton, U.S. Pat. No. 4,415,867 to Rubin, U.S. Pat. No. 4,890,155 to Miyagawa et al., U.S. Pat. No. 4,901,041 to Pengelly, and U.S. Pat. No. 4,951,014 to Wohlert et al. various types of microwave circuits, packages and carriers are described. None of these prior art patents disclose the unique features, structure and method of mounting a semiconductor chip to a metalized substrate as described below.

In U.S. Pat. No. 4,626,805 to Jones, a surface mountable microwave IC package is described wherein transmission lines are printed on a printed circuit board. The transmission lines on the circuit board are connected to co-planar transmission lines on a backside of a carrier substrate. One of the transmission lines on the backside of the carrier substrate is connected to a topside microstrip line on top of the carrier substrate using a "through-hole" in the substrate. The "through-hole" being similar to a "via hole" as used in the description of the subject invention. To compensate for inductance added by the hole and the transmission line ends, a gap is adjusted to provide for compensation capacitance. The subject invention includes a microcover which attaches directly to the semiconductor chip providing for both hermetic sealing and shielding. While the subject patent describes similar structural features when compared to the invention described herein, such as the use of a through-hole or via hole, the similarities between the two inventions end here. Specifically, the Jones patent describes a microwave package and does not address the importance of providing a unique method as described herein of mounting and connecting semiconductor chips on a motherboard and the like through the use of properly indexed via holes on the substrate. Also, the Jones patent describes the use of a single through-hole in a carrier substrate received on top of a printed circuit board. The subject method of mounting semiconductor chips uses one or more via holes to connect a semiconductor chip on top of a metalized substrate such as a mother board. Further, the Jones patent does not address the importance and distinction of accurate via hole alignment and bonding for improved impedance transition from chip to substrate. Still further, the Jones patent discloses the use of wire bonds for interconnecting microwave chips which the subject invention eliminates.

SUMMARY OF THE INVENTION

In view of the foregoing, it is an object of the present invention to provide a unique method of mounting and interconnecting a variety of different types of semiconductor chips, such as microwave, digital and analog chips, on a metalized substrate. One or more chips may be connected to the substrate. Also, a plurality of chips can be interconnected using the substrate as a connecting medium. Further, the chips may be used for both low and high frequency applications.

Another object of the invention is to provide a better way of electrically connecting semiconductor chips to carrier substrates and eliminating the use of wire and ribbon bonds in connecting a chip to a substrate and interconnecting a chip to another chip on a substrate.

Still another object of the invention is that through the use of carefully designed geometries of transmission lines and grounds along with the accurately indexing the connections thereto, uniform impedance transition is obtained.

A further object of the subject method of mounting and connecting semiconductor chips is by proper chip positioning on the carrier substrate and designing the transition from chip to substrate to be tolerant to position errors in a range of 0.5 mils or less, the integrity of the impedance match is easily maintained.

Still a further object of the invention is through the use of a thin film bonding agent, such as solder on the substrate, the bonding agent can be used to provide surface tension for self alignment of the connections on the bottom of the chip to the connections on top of the substrate.

The subject method as described herein provides for mounting and interconnecting semiconductor chips, such as microwave chips, digital chips, analog chips and the like, on a top portion of a metalized carrier substrate. Each chip includes electrical circuitry on a top portion thereof with the circuitry connected to one end of a transmission line. Another end of the transmission line is connected to a metalized via hole. The via hole passes from the top portion of the chip to a bottom portion of the chip. The chip, prior to mounting on the substrate, is positioned over the top portion of the substrate and lowered thereon either by hand or with a mechanical chip carrying device. The bottom portion of the metalized via hole is indexed over a top of one end of a transmission line on the top portion of the substrate with the indexing tolerance between the two interfacing surfaces in a range of 0.5 to 10 mils. The close tolerance allows for proper alignment and uniform impedance transition between the chip and the substrate. After indexing the bottom of the via hole on the top of the end of the transmission line on the substrate, the chip is bonded to the substrate. The semiconductor chip may be attached to the carrier substrate using solder. A very thin controlled layer of solder is used to minimize thermal and electrical resistance and to establish a necessary integrity of chip-to-substrate interface attachment. Further, a bonding agent such as solder can be used in enhancing self alignment between the chip and substrate through the use of surface tension between a thin layer of solder on top of the substrate and metalized connectors on the bottom of the semiconductor chip. Epoxy can also be used as a bonding agent if desired.

These and other objects of the present invention will become apparent to those skilled in the art of semiconductor technology from the following detailed description, showing the novel construction, combination, elements and method steps as herein described, and more particularly defined by the appended claims, it being understood that changes in the precise embodiments to the herein disclosed invention are meant to be included as coming within the scope of the claims, except insofar as they may be precluded by the prior art.

BRIEF DESCRIPTION OF THE DRAWINGS

The accompanying drawings illustrate complete preferred embodiments of the present invention according to the best modes presently devised for the practical application of the principles thereof, and in which.

DESCRIPTION OF THE PREFERRED EMBODIMENTS

Figure 1:
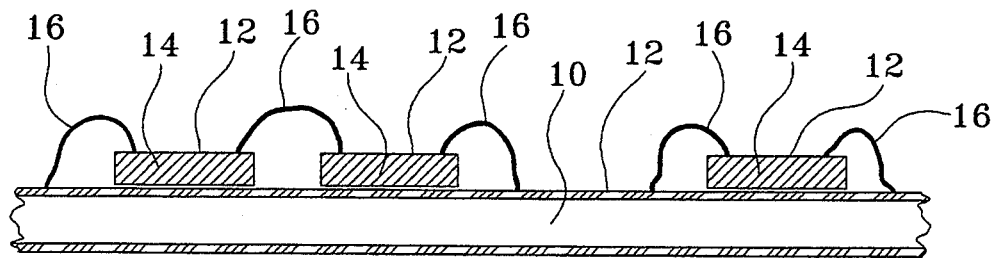
FIG. 1 is a side view of a portion of a carrier substrate with three semiconductor chips mounted thereon and using prior art wire bonds connecting the chips to the substrate and one chip to another. The chips are shown in cross section.

In FIG. 1 a side view of a portion of a carrier substrate 10 is shown having a conductive coating 12 on the top thereof. The coating 12 can, for example, be gold and have a thickness in a range of 0.15 mils. Mounted on top of the substrate 10 are three semiconductor chips 14 also having a 0.15 rail coating 12 of gold or a like conductive coating on both the top and bottom of the chip. The chips 14 include an electrical circuit design etched or masked on the top thereof. In this drawing, the chips 14 are shown in cross section. Also, in this view, prior art wire bonds 16 are shown connecting the chips 14 to the substrate 10 and also two of the chips 14 connected to each other with a single wire bond 16. As mentioned above, the wire bonds 16, ribbon bonds and like connectors generally introduce significant undesirable reactance which affects circuit performance. Also, the reactance of these bonds varies from one circuit to another, especially when the bonds are made manually. Further, when complex chips are mounted on a carrier substrate and a large number of bonds are required, performance uncertainty is introduced along with expensive assembly costs and reduced reliability.

Figure 2:
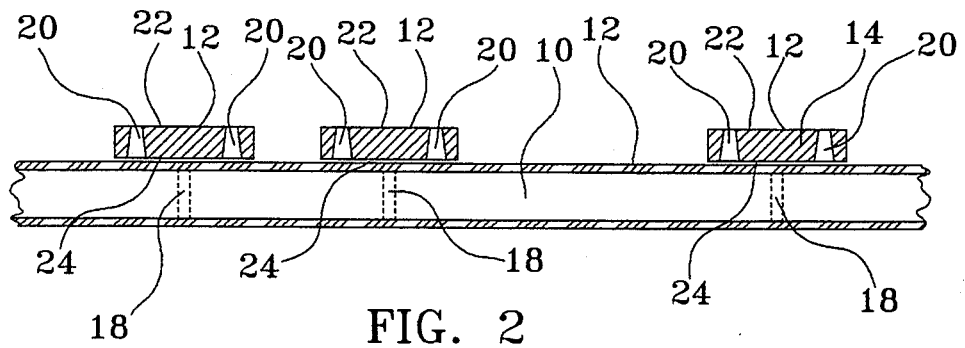
FIG. 2 is a side view of a portion of a carrier substrate with three semiconductor chips mounted thereon and using the subject method of mounting chips as described herein. The chips are shown in cross section and exposing a pair of via holes in each chip.

In FIG. 2 a side view of the carrier substrate 10 is shown with three semiconductor chips 14 mounted thereon and incorporating the subject method of mounting and interconnecting semiconductor chips. The chips 14 are disposed above optional vacuum holes 18 through the substrate 10. The vacuum holes 18 are used to hold the chips 14 in place prior to bonding the chips 14 to the carrier substrate 10. In this view, a sectional view of the chips 14 is shown with a pair of transmission via holes 20 in each chip 14 extending downwardly from a top portion 22 of the chip 14 to a bottom portion 24 of the chip 14. The transmission via holes 20 are metalized for transmitting signals from transmission lines connected to a circuit design in the top portion 22 of the chip 14 to donut shaped transmission pads on the bottom portion 24 of the chip 14. The transmission via holes 20 and donut shaped transmission pads are shown clearly in FIG. 5.

Figure 3:
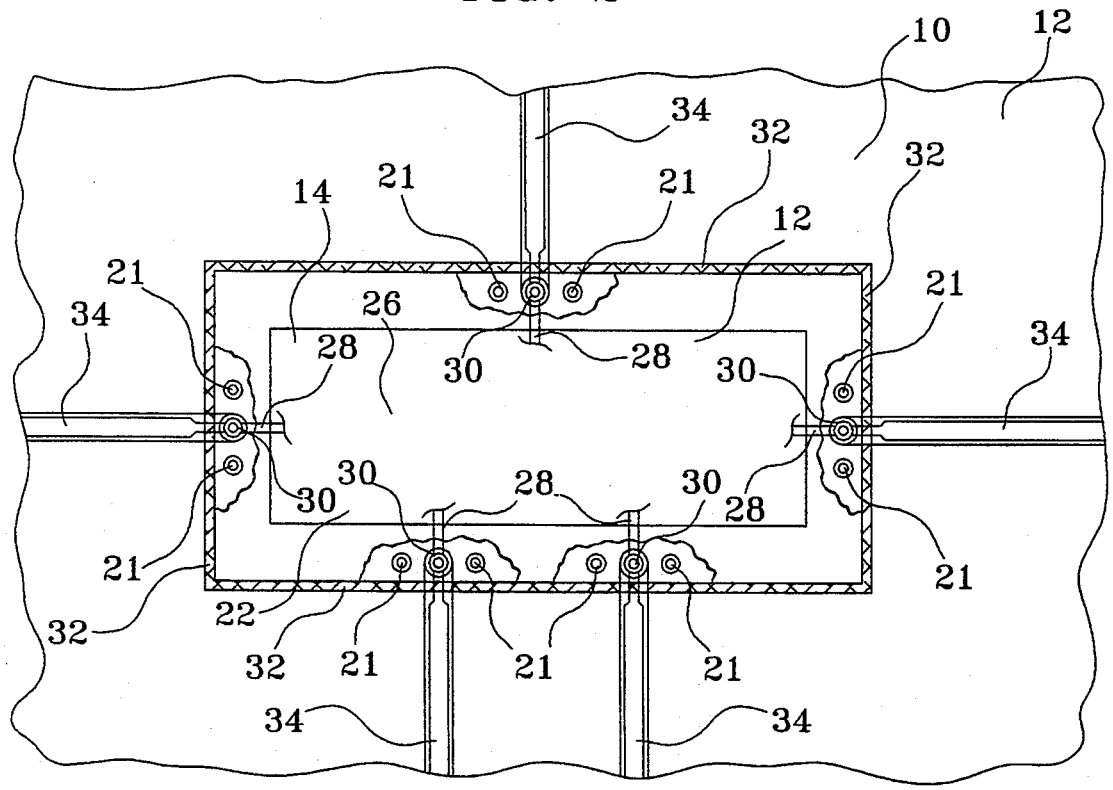
FIG. 3 is a top view of a semiconductor chip mounted on top of a portion of a metalized carrier substrate with a plurality of transmission lines extending outwardly from an electrical circuit design on top of the chip and connected to transmission lines on the substrate.

In FIG. 3 a top view of a semiconductor chip 14 is shown mounted on a portion of the carrier substrate 10. The chip 14 includes a circuit design 26 having in this example five transmission lines 28 connected at one end to the circuit design 26 and another end connected to a transmission pad 30 at a periphery 32 of the chip 14. In this view a portion of the conductive coating 12 is cut away adjacent the transmission pads 30 to expose a pair of metalized ground via holes 21 on adjacent sides of a signal transmission via hole 20 connected to the transmission pad 30. It has been found in high frequency applications using microwave semiconductor chips, the use of ground via holes 21 disposed next to the signal transmission via hole 20 greatly improve the quality of signal transmission.

Also shown in this view, is the bottom of the transmission via holes 20 connected to one end of substrate transmission lines extending outwardly from the circuit design 26 to the periphery 32 of the chip 14, it should be appreciated that the transmission lines 28 can easily be placed at various positions internally in the circuit design 26 and connected to the transmission pads 30 and via holes 20.

Figure 4:
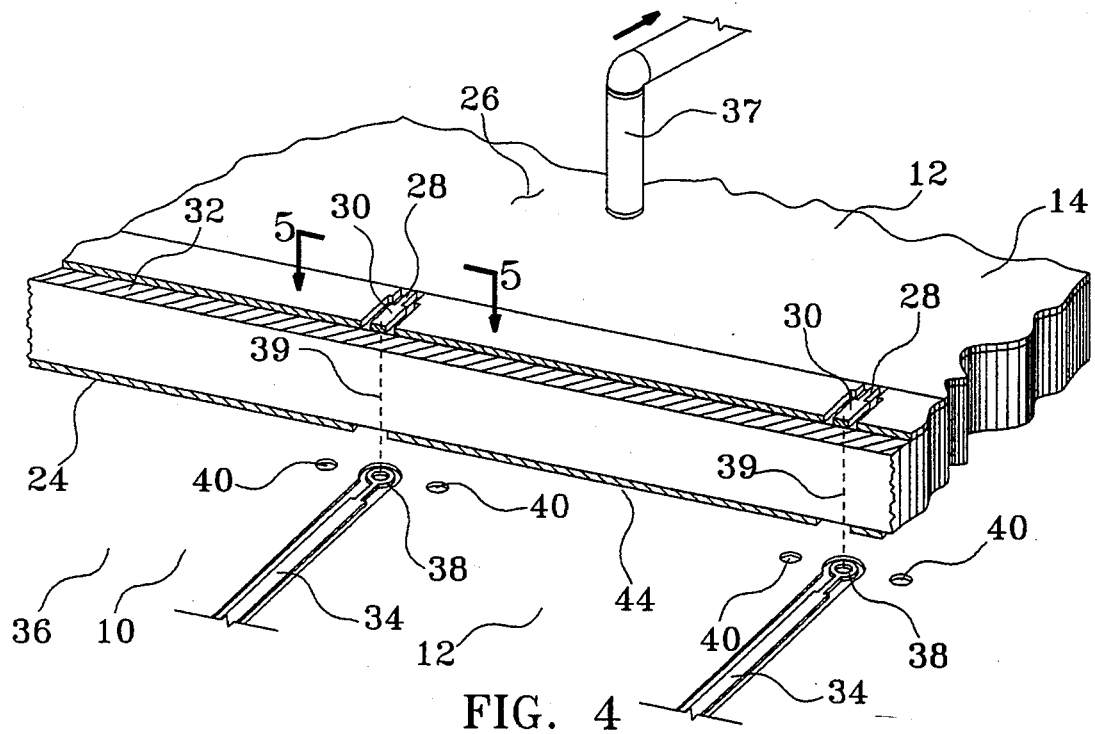
FIG. 4 is an enlarged perspective view of a portion of the semiconductor chip shown in FIG. 3 and showing the subject method of mounting the chip on the substrate and connecting two of the transmission lines on the chip to transmission lines on the carrier substrate.

Referring now to FIG. 4, an enlarged perspective view of a portion of the semiconductor chip 14 is shown positioned above a top portion 36 of the substrate 10. In this example, a vacuum needle 37 is used to hold and lower the chip 14 into proper alignment on top of the substrate 10. While the vacuum needle 37 is shown for holding and lowering the chip 14 on the substrate 10, a skilled technician could manually use a pair of tweezers, a collet having a chip frame for holding the chip 14 therein or any other automated chip installation device.

Figure 5:
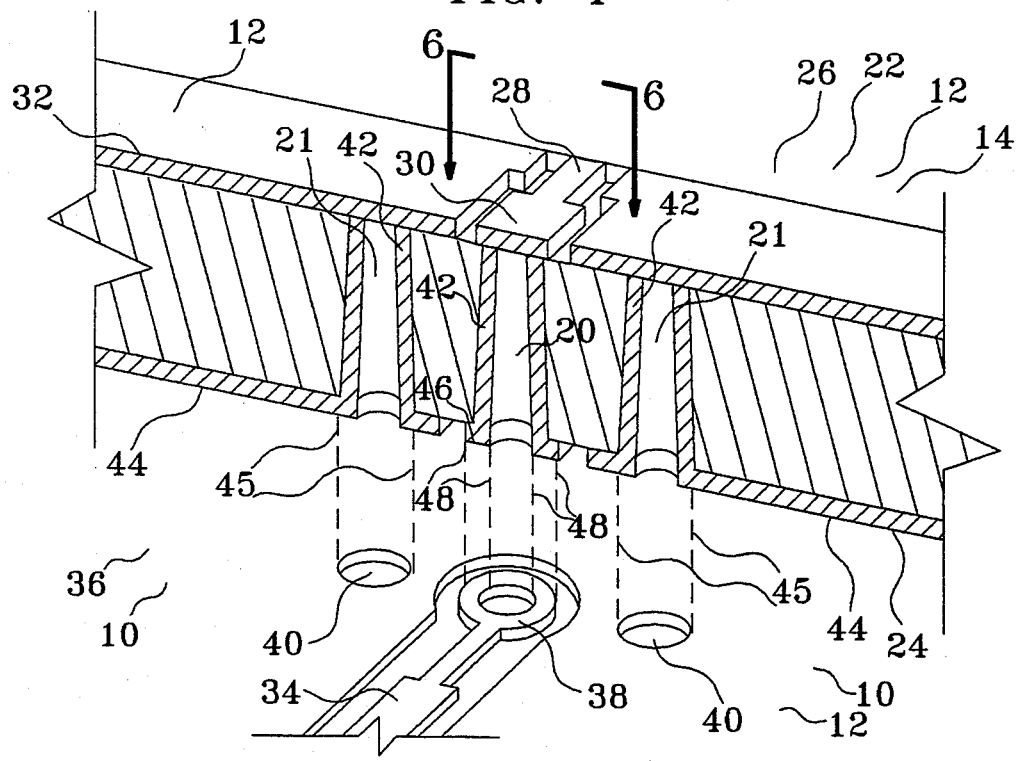
FIG. 5 is an enlarged perspective view of a portion of the semiconductor chip and carrier substrate shown taken along lines 5—5 as shown in FIG. 4.

In this drawing, the carrier substrate 10 is shown with substrate transmission lines 34 having one end attached to a donut shaped substrate transmission pad 38, which is disposed underneath the chip transmission pads 30 and via holes 20. The alignment of pads 38 under the chip transmission pads 30 is Indicated by dotted lines 39. The metalized via holes 20 connected to the pads 30 are not shown in this figure. On opposite sides of the transmission pads are circular holes 40 formed through the conductive coating 12 of the carrier substrate 10. These holes 40 are indexed with the opening in the bottom of the ground via holes 20 on opposite sides of the signal transmission via hole as shown in FIG. 3. The holes 40 act to prevent a bonding agent, used to secure the chip 14 on top of the carrier substrate 10, from moving or wicking upwardly inside the ground via hole 21 and causing undesired stress in the adjacent materials.

in FIG. 5 an enlarged perspective view is shown of the chip 14 and the carrier substrate 10 taken along lines 5—5 as seen in FIG. 4. In this view a portion of a signal transmission via hole 20 and the adjacent ground via holes 21 have been cut away to show a metalized via hole lining 42. The via hole lining 42 in the ground via holes 21 provides a ground from the conductive coating 12 on the top portion 22 of the chip 14 to a conductive coating 44 on the bottom portion 24 of the chip 14. When the chip 14 is bonded to the top portion 36 of the carrier substrate 10, the connection from the conductive coating 44 to the conductive coating 12 on the carrier substrate 10 is completed thereby providing an effective ground between the chip 14 and carrier substrate 10. The placement or alignment of the conductive coating 44 on the bottom of the chip 14 to the top of the carrier substrate conductive coating 12 is indicated by dotted lines 45.

At the bottom of the signal transmission via hole 20 is a donut shaped chip transmission pad 46 connect to the via hole lining 42. The donut shaped chip transmission pad 46 is identical in shape to the donut shaped substrate transmission pad 38 for providing proper alignment and to assure a uniform impedance transition. While the pads 38 and 46 are shown having a donut shape, it can be appreciated that the pads can have a variety of different geometric shapes without departing from the spirit and scope of the invention. The substrate transmission pad 38, if desired, can be slightly larger than the chip transmission pad 46 to minimize an impedance mismatch if a slight misalignment occurs. The alignment between the two donut shaped transmission pads 38 and 46 is indicated by dotted lines 48.

In mounting the semiconductor chip 14, the chip 14 is positioned above and lowered on the carrier substrate 10 using some type of carrying and installation device such as the vacuum needle 37 shown in FIG. 4. As the chip 14 is lower on the top portion 36 of the substrate 10, the donut shaped chip transmission pad 46 is indexed with the donut shaped substrate transmission pad 38. This positioning of the two pads 46 and 38 one on top of the other is tolerant of error, for example, of plus or minus 1 mil with the integrity of the impedance match between the chip 14 and substrate 10 maintained. Today, the state-of-the-art in automatic chip bonding (positioning) is approx. 0.0005 inches.

Figures 6, 7:
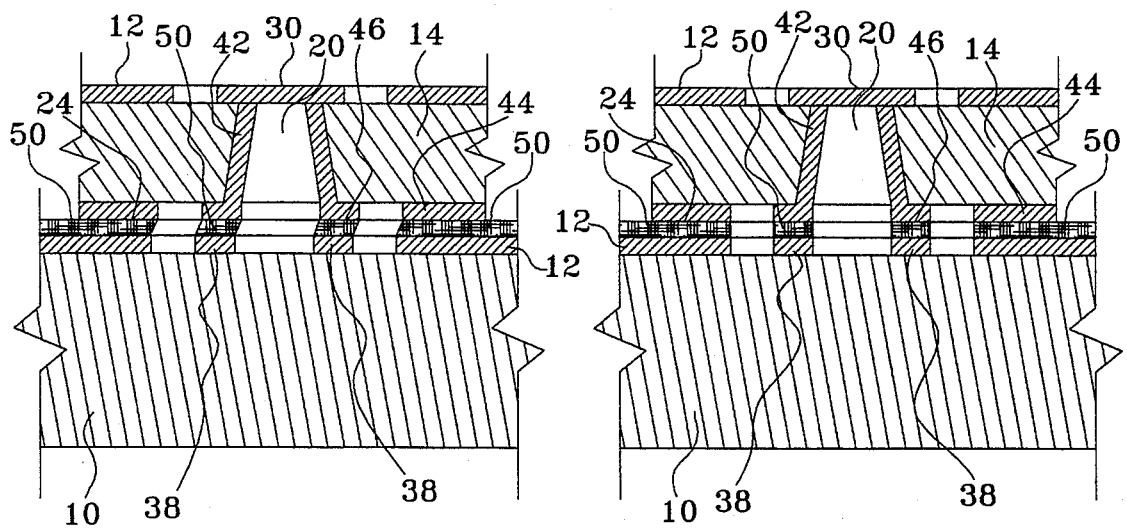
FIG. 6 and 7 illustrate a greatly enlarged front cross section of the chip and carrier substrate taken along lines 6—6 shown in FIG. 5 and illustrating a self alignment feature of a solder bonding agent.

Referring now to FIG. 6, as the indexing of the chip 14 on top of the substrate 10 occurs, the chip 14 is bonded to the substrate 10 using a thin film of solder. FIG. 6 is a front sectional view taken along lines 6—6 shown in FIG. 5. The solder is shown as a darkened area 50 between the conductive coating 44 on the bottom portion 24 of the chip 14 and the conductive coating 12 of the substrate 10. The solder 50 is heated into a liquid state by heating the substrate 10 in a temperature range of 300 to 325 degrees F. Also, a chip holding device can be heated to heat the chip 12. The heated chip 12 as it is lowered and indexed on top of the substrate 10 can also be used to liquify the bonding agent. It has been found that in using certain bonding agents such as solder 50 in a liquid state, an automatic self alignment is introduced as the chip 14 floats on top of the carrier substrate 10. In FIG. 6 the chip 14 is shown slightly misaligned or skewed toward the right from the top of the conductive coating 12 and from the top of the donut shaped substrate transmission pad 38. In FIG. 7, before the liquid solder 50 cools to a solid state, the chip 14 is shown moving from right to left to a desired position on the carrier substrate 10. This self alignment feature due to surface tension helps enhance accurate placement of the chip transmission pad 46 directly on top of the substrate transmission pad 38. This enhanced alignment feature provides for alignment of the chip 14 on the carrier substrate 10 within a range of less than 0.5 mils.

Figure 8:
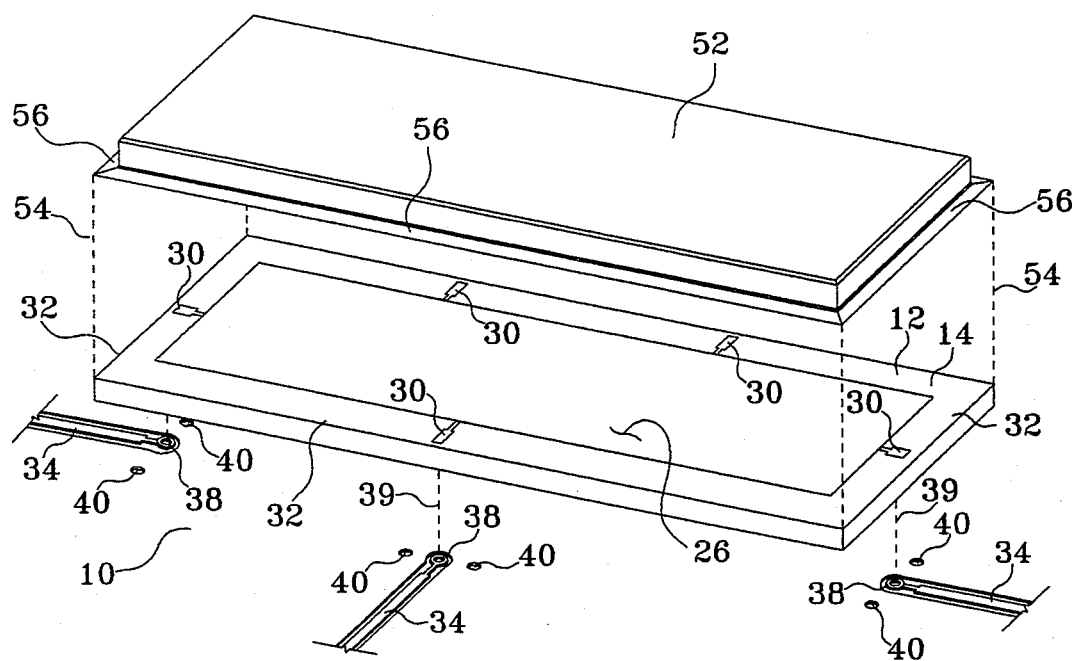
FIG. 8 is a perspective view of the semiconductor chip with a protective microcover positioned above the chip. The microcover is used for hermetically sealing the chip when it is bonded on top of the carrier substrate.

In FIG. 8 a perspective view of the chip 14 with circuit design 26 is shown mounted on the carrier substrate 10 and incorporating the unique method for mounting and interconnecting a variety of different types of chips on a substrate as described above. In this view, the chip 14 is shown with a protective microcover 52 positioned directly above the chip as shown by dotted lines 54. The microcover 52 is angular in shape having dimensions is a range of 0.025 to 0.25 per side. Edges 56 of the microcover 52 engage the periphery 32 of the chip 14 when the microcover 52 is lowered on top of the chip 14. The edges 56 are secured to the chip 14 using a solder, epoxy and the like. The microcover 52 is used to hermetically seal, shield and otherwise protect the chip 14 on the substrate 10. It should be noted that securing the microcover 52, using solder and the like, to the top of the chip 14 does not interfere with any of the electrical connections between the chip 14 and the substrate 10, since the transmission pads 30 and via holes 20 and 21 are recessed away from the periphery 32 of the chip 14. Obviously, prior art connections using wire and ribbon bonds between chips 14 and the carrier substrate 10 would engage the edges 56 of the microcover 52 making the hermetically sealing of the chip difficult if not impossible. The subject method of mounting and connecting semiconductor chips and substrates eliminates this difficulty.

While the invention has been particularly shown, described and illustrated in detail with reference to the preferred embodiments and modifications thereof, it should be understood by those skilled in the art that equivalent changes in form and detail may be made therein without departing from the true spirit and scope of the invention as claimed, except as precluded by the prior art.

The embodiments of the invention for which an exclusive privilege and property right is claimed are defined as follows:

1. A semiconductor chip, such as a microwave chip, a digital chip, an analog chip and the like, for mounting on a metalized carrier substrate such as a mother board and connecting to a circular geometric shape of one end of a substrate transmission line, the chip having electrical circuitry on a top portion thereof, the chip comprising:

at least one chip signal transmission line, one end of said transmission line connected to the circuitry, and;

a metalized chip signal transmission via hole, said transmission via hole extending from the top portion of the chip to a bottom portion of the chip, another end of said transmission line connected to said transmission via hole, said transmission via hole having a metalized bottom portion having a circular geometric shape corresponding to the circular geometric shape of one end of the substrate transmission line.

2. The semiconductor chip as described in claim 1 further including at least one metalized chip ground via hole for grounding the chip on the substrate, said ground via hole extending from the top portion of the chip to a bottom portion of the chip and engaging a metalized surface on the top portion of the substrate.

3. The semiconductor chip as described in claim 2 wherein a bottom portion of said ground via hole engages a periphery around a hole through a metalized surface in the top of the substrate.

4. The semiconductor chip as described in claim 1 further including a pair of metalized chip ground via holes for grounding the chip on the substrate, said ground via holes disposed on opposite sides of said transmission via hole and extending from the top portion of the chip to a bottom portion of the chip and engaging a metalized surface on the top portion of the substrate.

5. The semiconductor chip as described in claim 4 wherein a bottom portion of said ground via holes engages a periphery around a pair of holes through a metalized surface in the top of the substrate.

6. The semiconductor chip as described in claim 1 wherein the metalized bottom portion of said transmission via hole has an annular shape corresponding to an annular shape of one end of the substrate transmission line.

7. The semiconductor chip as described in claim 1 further including a microcover for receipt on the top portion of the chip and disposed around a periphery of the top portion of the chip and hermetically sealed thereto.

8. The semiconductor chip as described in claim 1 further including a plurality of transmission via holes connected to a plurality of chip signal transmission lines connected to the circuitry.

9. The semiconductor chip as described in claim 8 wherein said transmission via holes are disposed on the chip inwardly and away from a periphery of the top portion of the chip.

10. A semiconductor chip, such as a microwave chip, a digital chip, an analog chip and the like, for mounting on a metalized surface on top of a carrier substrate such as a mother board and connecting to an annular geometric shape of one end of a substrate transmission line, the chip having electrical circuitry on a top portion thereof, the chip comprising:

at least one chip signal transmission line, one end of said transmission line connected to the circuitry;

a metalized chip signal transmission via hole, said transmission via hole extending from the top portion of the chip to a bottom portion of the chip, another end of said transmission line connected to said transmission via hole, said transmission via hole having a metalized bottom portion having an annular geometric shape corresponding to the annular geometric shape of one end of the substrate transmission line, and;

a pair of metalized chip ground via holes for grounding the chip on the substrate, said ground via holes disposed on opposite sides of said transmission via hole and extending from the top portion of the chip to a bottom portion of the chip and engaging the metalized surface on the top portion of the substrate, said ground via holes having an annular bottom portion engaging a periphery around a pair of holes through the metalized surface in the top of the substrate.

11. The semiconductor chip as described in claim 10 further including a microcover for receipt on the top portion of the chip and disposed around a periphery of the top portion of the chip and hermetically sealed thereto.

12. The semiconductor chip as described in claim 10 further including a plurality of transmission via holes connected to a plurality of chip signal transmission lines connected to the circuitry.

13. The semiconductor chip as described in claim 12 wherein said transmission via holes are disposed on the chip inwardly and away from a periphery of the top portion of the chip.

14. A semiconductor chip, such as a microwave chip, a digital chip, an analog chip and the like, for mounting on a metalized surface on top of a carrier substrate such as a mother board and connecting to an annular geometric shape of one end of a plurality of substrate transmission lines, the chip having electrical circuitry on a top portion thereof, the chip comprising:

a plurality of chip signal transmission lines, one end of said transmission lines connected to the circuitry;

a plurality of metalized chip signal transmission via holes, said transmission via holes extending from the top portion of the chip to a bottom portion of the chip, another end of said transmission lines connected to said transmission via holes, said transmission via holes having a metalized bottom portion having an annular geometric shape corresponding to the annular geometric shape of one end of the substrate transmission lines;

a pair of metalized chip ground via holes for grounding the chip on the substrate, said ground via holes disposed on opposite sides of each of said transmission via holes and extending from the top portion of the chip to a bottom portion of the chip and engaging the metalized surface on the top portion of the substrate, said ground via holes having an annular bottom portion engaging a periphery around a pair of holes through the metalized surface in the top of the substrate, said transmission and ground via holes disposed on the chip inwardly and away from a periphery of the top portion of the chip; and a microcover for receipt on the top portion of the chip and disposed around a periphery of the top portion of the chip and hermetically sealed thereto.

* * * * *